United States Patent
Petrella et al.

(10) Patent No.: US 6,808,743 B2
(45) Date of Patent: Oct. 26, 2004

(54) GROWTH OF ZNO FILM USING SINGLE SOURCE CVD

(75) Inventors: Antonella Julie Petrella, Coogee (AU); Robert Norman Lamb, Engadine (AU); Nicholas Kenneth Roberts, Kirrawee (AU)

(73) Assignee: Unisearch Limited, Sydney (AU)

( * ) Notice: Subject to any disclaimer, the term of this patent is extended or adjusted under 35 U.S.C. 154(b) by 0 days.

(21) Appl. No.: 10/297,506

(22) PCT Filed: Jun. 6, 2001

(86) PCT No.: PCT/AU01/00673

§ 371 (c)(1),
(2), (4) Date: Apr. 9, 2003

(87) PCT Pub. No.: WO01/94661

PCT Pub. Date: Dec. 13, 2001

(65) Prior Publication Data

US 2003/0180581 A1 Sep. 25, 2003

(30) Foreign Application Priority Data

Jun. 6, 2000 (AU) ............................................. PQ8002

(51) Int. Cl.⁷ ............................................... C23C 16/40
(52) U.S. Cl. ................. 427/163.2; 427/166; 427/248.1; 427/255.19; 427/255.33
(58) Field of Search ................................. 428/697, 699, 428/700, 701, 702, 432; 427/163.2, 166, 248.1, 255.19, 255.33

(56) References Cited

U.S. PATENT DOCUMENTS

| | | | |
|---|---|---|---|
| 5,002,796 A | * | 3/1991 | Nishida ....................... 427/573 |
| 5,545,443 A | | 8/1996 | Yamada et al. |
| 6,416,814 B1 | * | 7/2002 | Giolando ..................... 427/166 |

FOREIGN PATENT DOCUMENTS

| | | | | |
|---|---|---|---|---|
| EP | | 0204563 | 1/1993 | |
| WO | WO 9850316 A1 | * | 11/1998 | ........... C03C/25/02 |

OTHER PUBLICATIONS

Koch et al. J. Phys. Chem. B 101 (1997) pp. 8231–8236.*

* cited by examiner

Primary Examiner—Timothy Meeks
(74) Attorney, Agent, or Firm—Ladas & Parry LLP

(57) ABSTRACT

The present invention relates to a method of growing a ZnO film using chemical vapour deposition (CVD), and to a ZnO film grown according to the method. The method includes providing a precursor in vapour form, the precursor substantially comprising $Zn_4O(O_2CNR_AR_B)_6$, where $R_A$ and $R_B$ are any combination of akyl or perfluoroalkyl groups, and decomposing at least some of the vapour at the surface of the substrate such that the film of zinc oxide forms. An advantage of using this precursor material is that, unlike in the prior art, no deliberate introduction of water vapour to improve christallographic orientation is required. Higher purities in oxide films are produced.

15 Claims, 3 Drawing Sheets

GROWTH OF ZNO FILM USING SINGLE SOURCE CVD

TECHNICAL FIELD

The present invention relates to a method of growing a ZnO film using chemical vapour deposition (CVD), and to a ZnO film grown according to the method.

BACKGROUND OF THE INVENTION

Zinc oxide is a material which, when prepared as a polycrystalline thin solid film, has a variety of useful applications, including gas sensors, surface acoustic wave (SAW) devices, optical modulators, optical waveguides, and piezoelectric actuators for micro-machines. The wide range of applications stems from the fact that zinc oxide is a semiconductor with a wide optical bandgap (3.3 eV) and has piezoelectric and electrooptic effects which can be exploited. The magnitudes of the electrooptic and the piezoelectric effects in polycrystalline films of zinc oxide tend to be less than in single crystal zinc oxide, but can be maximised by growing a film such that the grains have a preferred crystallographic orientation, such as the (0001) orientation.

A variety of different techniques have been used to grow thin solid films of zinc oxide, including chemical vapour deposition (CVD), spray pyrolisis, reactive evaporation, and sputtering. Of these techniques, CVD is gaining popularity as it allows films to be grown on substrates with non-planar surfaces, and is a low energy process which causes minimal damage to the substrate surface. CVD involves reacting a vapour of one or more precursors at a surface of a heated substrate such that stoichiometric crystals of zinc oxide are gradually grown. One prior art CVD method involves growing zinc oxide films from a vapour of basic zinc acetate, but has the disadvantage that it requires the introduction of water vapour to improve the crystallographic orientation and to remove unwanted organic by-products.

SUMMARY OF THE INVENTION

According to a first aspect of the present invention there is provided a method of growing a zinc oxide film on a surface of a substrate by chemical vapour deposition, the method comprising the steps of:
a) providing a precursor in vapour form, the precursor substantially comprising $Zn_4O(O_2CNR_AR_B)_6$, where $R_A$ and $R_B$ are any combination of alkyl or perfluoralkyl groups;
b) decomposing at least some of the vapour at the surface of the substrate such that the film of zinc oxide forms.

Preferably, the method does not require deliberate introduction of water vapour in order to produce high purity zinc oxide films. Preferably, the number of carbon atoms in the alkyl group is in the range from 1 to 106. Examples of $R_A/R_B$ groups which can be substituted in the precursor include methyl groups ($CH_3$), ethyl groups ($CH_3CH_2$), propyl groups ($CH_3(CH_2)_2$), isopropyl ($CH_3CHCH_3$) etc. they also include any perfluoroalkyl group.

Preferably, the surface of the substrate is heated to an optimal temperature which promotes decomposition of the vapour such that a film of zinc oxide substantially free of impurities forms on the surface. Preferably, the temperature of the substrate surface is low enough to substantially prevent fragmentation of the alkyl or perfluorakyl groups.

In a particularly favourable embodiment, the precursor comprises $Zn_4O(O_2CN(CH_2CH_3)_2)_6$. In this embodiment, a substrate temperature can be found which makes it unnecessary to deliberately introduce water vapour in order to produce high purity zinc oxide films. It has been found that zinc oxide films grown with this precursor tend to have a piezoelectric coefficient ($d_{33}$) close to that of single crystal zinc oxide (12 pm/V). The surface of the substrate may be heated in this embodiment to a temperature in the range from 300° C. to 600° C., more preferably 350° C. to 450° C. Advantageously, in order to grow a highly pure zinc oxide film from $Zn_4O(O_2CN(CH_2CH_3)_2)_6$, the surface of the substrate should be heated to a temperature of substantially 400° C. The inventors believe that at this temperature the precursor vapour decomposes at the surface of the substrate according to following reaction:

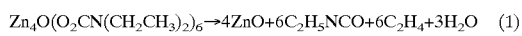

$$Zn_4O(O_2CN(CH_2CH_3)_2)_6 \rightarrow 4ZnO + 6C_2H_5NCO + 6C_2H_4 + 3H_2O \quad (1)$$

The products $C_2H_5NCO$, $H_2O$ and $C_2H_4$, are volatile in vacuum, and thus tend not to be incorporated into the zinc oxide film.

Step (a) of providing a precursor in vapour form may comprise subliming a precursor source material such that the precursor vapour is produced. In one embodiment, step (a) comprises subliming a precursor source material in a Knudsen cell. Walls of the Knudsen cell are heated to a temperature at least as great as the sublimation temperature of the precursor source material, and the Knudsen cell includes at least one aperture for enabling the sublimed precursor to escape from the Knudsen cell in vapour form. For example, if the precursor source material comprises $Zn_4O(O_2CN(CH_2CH_3)_2)_2$, which has a sublimation temperature under vacuum of ~170° C., ~0.1 mmHg the Knudsen cell may be heated to about 190° C.–195° C.

According to a second aspect of the present invention there is provided a method of growing a zinc oxide film on a surface of a substrate, the method comprising carrying out chemical vapour deposition from a single precursor, the precursor being suitable for decomposing at the surface of the substrate such that a film of zinc oxide forms without deliberate introduction of water vapour.

Preferably, the precursor forms the film during the chemical vapour deposition without deliberate introduction of any other reactant, catalyst, or carrier gas. The precursor of the second aspect may be in accordance with any one of the precursors described in the first aspect of the invention.

The first and second aspects of the invention preferably form a highly crystalline film.

Advantageously, the zinc oxide film grows with a preferred grain orientation that is substantially independent of the atomic structure of the substrate. The film may have a single grain orientation, such as a (001) orientation. The substrate may be arranged to have a crystalline structure and lattice parameter similar to those of bulk zinc oxide in order to promote epitaxial single crystal growth. The surface of the substrate can be planar or non-planar, and can be formed from the silicon, silicon dioxide, copper, platinum, gold, chromium, glass, or any other suitable material.

The substrate of the first and second aspects of the invention may be an optical fibre which is mounted such that the fibre can be rotated during film growth to ensure that the film has a relatively uniform film thickness. The optical fibre maybe pre-coated with one or more other materials, such as an electrode material. The first and second aspects of the invention may include a step of monitoring the temperature of the surface of the substrate in order to control heating of the substrate.

The first and second aspects of the invention are preferably carried out under vacuum conditions, pressures below $10^{-1}$ Torr are advantageous.

According to a third aspect of the present invention there is provided a solid zinc oxide film grown by chemical vapour deposition from a precursor which substantially comprises $Zn_4O(O_2CNR_AR_B)_6$, where $R_A$, $R_B$ are any combination of alkyl or perfluoroalkyl groups.

According to a fourth aspect of the present invention there is provided a solid zinc oxide film grown by chemical vapour deposition from a single precursor without introduction of water vapour.

Preferably, the zinc oxide film is grown from the single precursor without the introduction of any other reactant, catalyst, or carrier gas.

According to a fifth aspect of the present invention there is provided a substrate having a coating, at least a part of the coating comprising a zinc oxide film grown by chemical vapour deposition from a precursor which substantially comprises $Zn_4O(O_2CNR_AR_B)_6$, where $R_A$ and $R_B$ are any combination of alkyl or perfluoroalkyl groups.

According to a sixth aspect of the present invention there is provided a substrate having a coating, at least a part of the coating comprising a solid zinc oxide film grown by chemical vapour deposition from a single precursor without introduction of water vapour.

The substrate of the fifth and sixth aspects of the invention may include an optical fibre, or a portion of an optical fibre.

Throughout this specification, unless the context requires otherwise, the word 'comprise' or other variations such as 'comprises' or 'comprising', will be understood to imply the inclusion of a stated element or integer, or group of elements or integers, but not the exclusion of any other element or integer, or group of elements or integers.

An embodiment of invention will now be described, by way of example only, with reference to accompanying drawings.

DETAILED DESCRIPTION OF THE DRAWINGS

Figure 1:
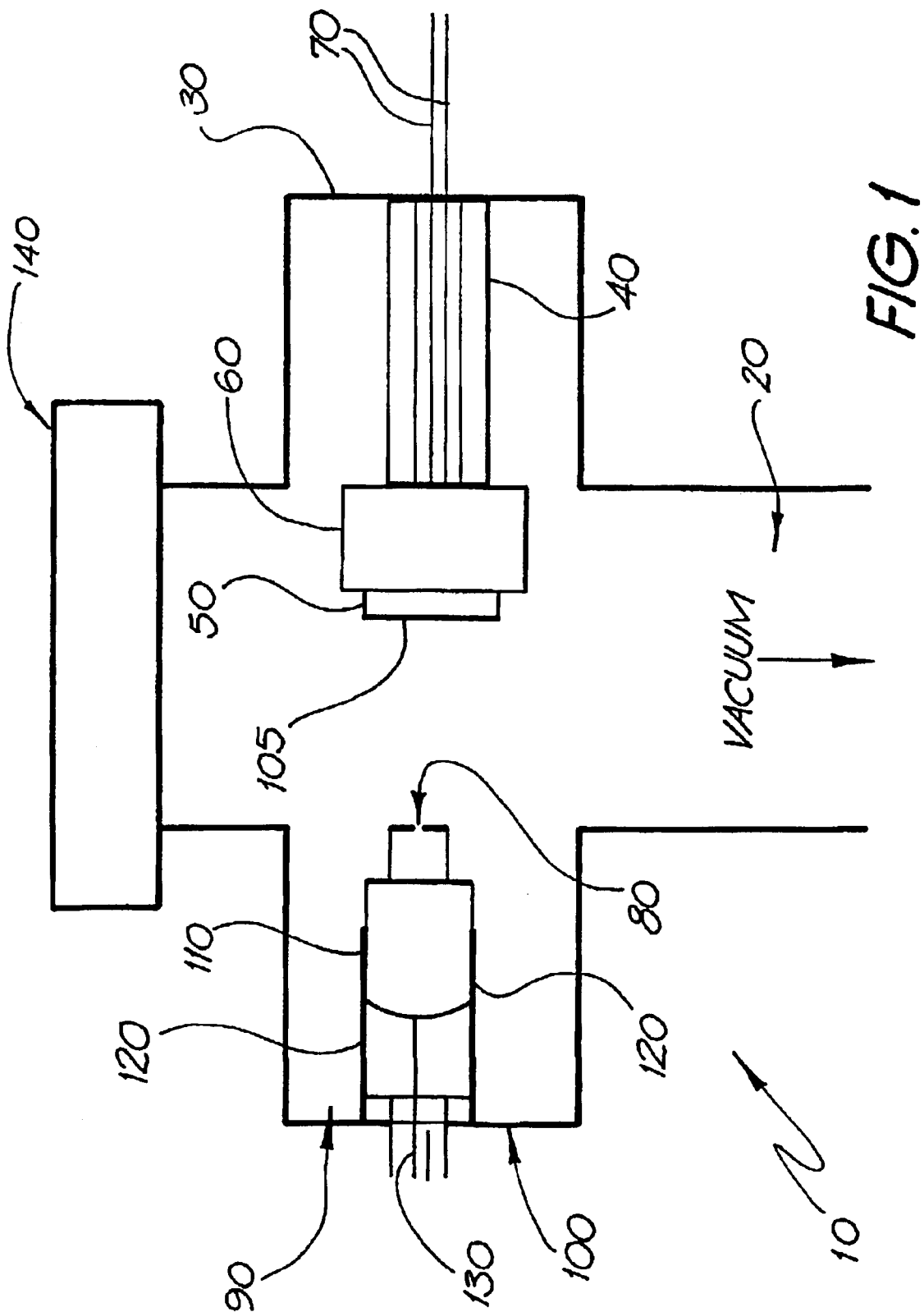
FIG. 1 show a diagram of a chamber for growing a zinc oxide film according to an embodiment of the prevent invention.

A vacuum chamber 10 suitable for growing a zinc oxide film in accordance with an embodiment of the present invention is shown in FIG. 1. Prior to growing a film, the chamber 10 is evacuated through an evacuation port 20 to a base pressure preferably below 0.1 Torr. A second port 30 of the chamber 10 holds a substrate heater 40 for heating a substrate 50 during the film growth process. The substrate 50 is attached to a heating block 60 of the substrate heater 40, and is heated by thermal conduction of heat flowing from the heating block 60 to the substrate 50. It is important that the substrate 50 makes good physical contact with the heating block 60 in order to ensure uniform substrate heating. The substrate heating block 60 is heated by internal resistive heating elements (not shown). The temperature of the heating blocking 60 is monitored with a thermocouple 70, and can be adjusted by controlling a flow of electric current through the heating elements.

The substrate heating block 60 holds the substrate directly opposite an aperture 80 of a Knudsen cell 90 mounted in a third port 100 of the chamber 10. The zinc oxide film grows on a surface 105 of the substrate 50 which faces the aperture 80. The Knudsen cell 90 includes a sublimation chamber 110 in which a precursor source material is heated to at least its sublimation temperature. The Knudsen cell 90 is heated by resistively-heated elements (not shown) mounted in walls 120 of the cell 90. The temperature of the Knudsen cell 90 is monitored with a second thermocouple 130. A viewing port 140 positioned above the substrate heater 40 and Knudsen cell 90 allows the film growth process to be visually monitored.

EXAMPLE

The chamber 10 described above was used to grow a zinc oxide film by chemical vapour deposition. The precursor source material was a powder of high purity $Zn_4O(O_2CN(CH_2CH_3)_2)_6$ The precursor source material had been synthesised in a clean reaction, and purification was completed via recrystallisation. The Knudsen cell 90 was heated to a temperature of 190° C. to form a precursor vapour, and the substrate 50 was heated to a temperature of 400° C. The substrate 50 was positioned at a distance of approximately 0.1 m from the aperture 80 of the Knudsen cell 100, and the film was grown over a period of approximately 3 hours. The resultant film was measured to have a thickness of approximately 600 nm. The growth rate was found to be dependent on the distance from the aperture 80 to the substrate surface 105.

Figure 2:
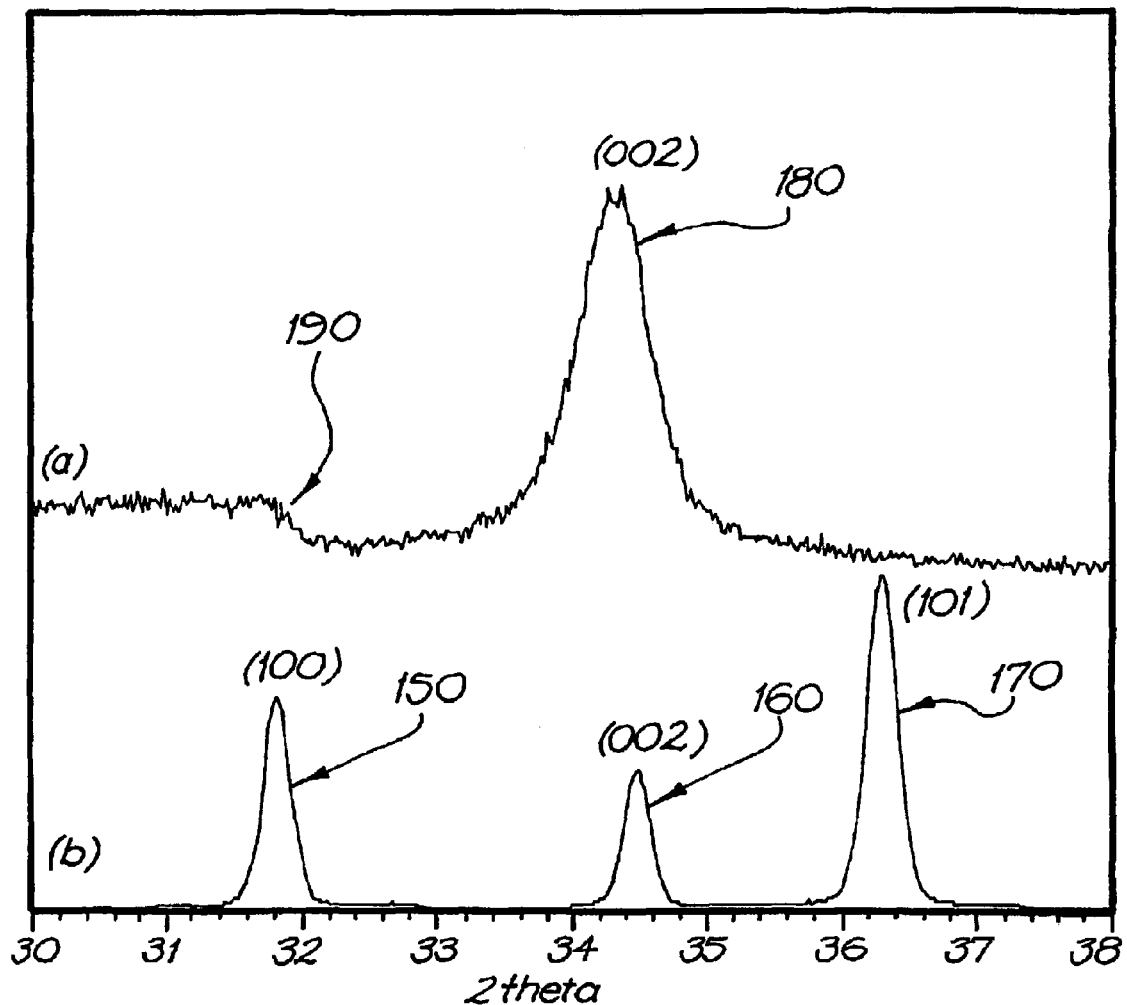
FIG. 2 shows X-ray diffraction scans for: (a) a zinc oxide film grown in accordance with an embodiment of the method of the present invention; and (b) a zinc oxide powder reference sample.

FIG. 2 shows portions of X-ray diffraction spectra for (a) the zinc oxide film, and (b) a zinc oxide powder reference. FIG. 2(b) shows that randomly-oriented zinc oxide gives rise to three reflections in this region of the X-ray diffraction spectrum, namely peaks 150, 160 and 170 which correspond to (100), (002) and (101) reflections, respectively. It can be seen that the only diffraction peak visible in FIG. 2(a) is the peak 180 corresponding to (002) reflections, which indicates that the film is significantly (001)-oriented. A small shoulder 190 in the spectrum at approximately 31.8° was found to be a feature caused by the substrate, rather than the film.

Figure 3:
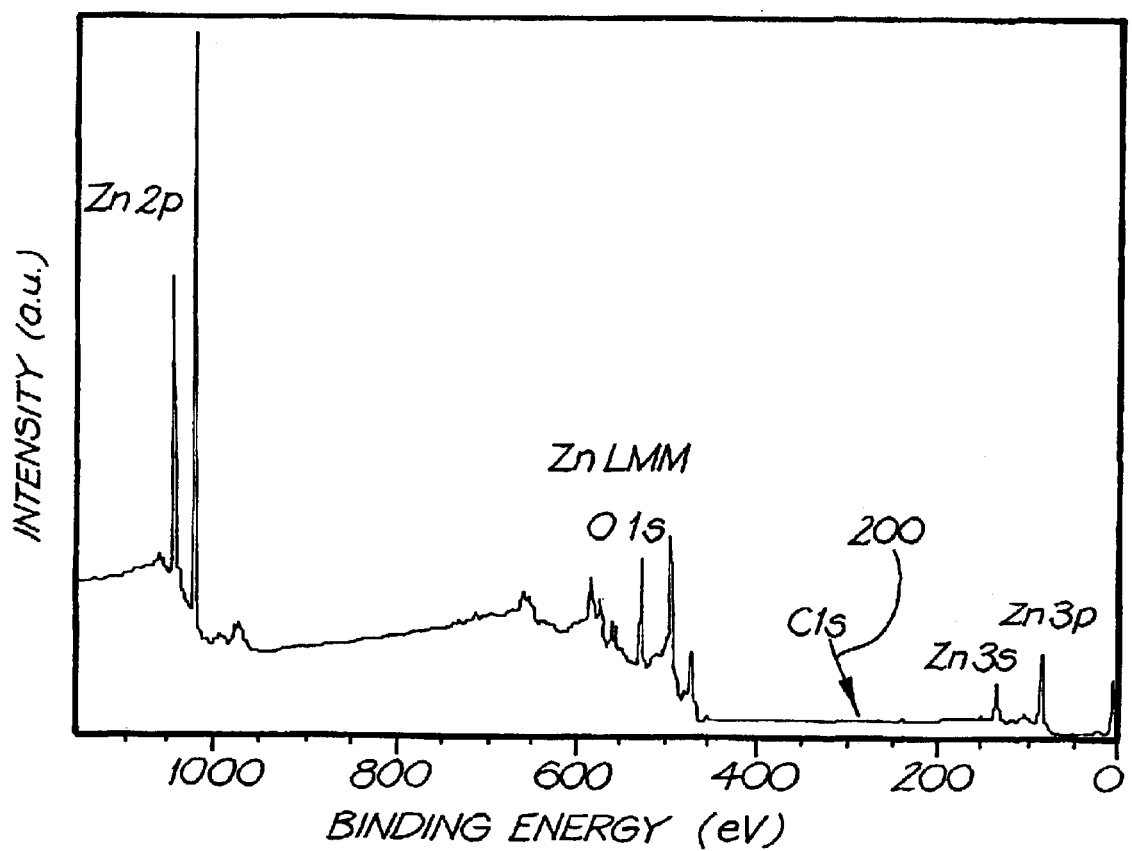
FIG. 3 shows a X-ray photoelectron (XPS) spectrum for a zinc oxide film grown in accordance with an embodiment of the present invention.

FIG. 3 shows an X-ray photoelectron binding energy spectrum of the same zinc oxide film. This spectrum provides a measure of the chemical composition of the film surface to a depth of approximately 5 nanometres, and displays peaks which are characteristic of a surface predominantly composed of zinc and oxygen. The spectrum also shows that the surface of the film contains negligible carbon contamination. Any carbon contamination would be indicated by a carbon 1s peak at a binding energy of approximally 285 eV. An arrow 200 in FIG. 3 points to the position where a carbon 1s peak would appear if carbon were present at the surface. The absence of a carbon 1s peak indicates that the organic component of the precursor did not become incorporated into the film during film growth.

The piezoelectric coefficient $d_{33}$ of the zinc oxide film was measured to be up to 10±2 pm/V, which is close to the single crystal value of 12 pm/V. It is believed that such a film will be useful as a piezoelectric transducer in devices such as optical modulators and micro-mechanical devices. The film should also have the electrooptical properties which would enable it to be used in various types of optical devices, such as modulators.

In the above example $R_A$ and $R_B$ are ethyl groups. As discussed in the preamble, they may be any combination of alkyl or perfluoroalkyl groups.

It will be understood by a person skilled in the art that the present invention includes within its scope all methods of producing a precursor vapour, and is not limited to the Knudsen cell design described above.

A person skilled in the art will also understand that the precursor may be mixed with a small quantity of other material, such as a metallic dopant, in order to modify the physical properties of the film.

It will be further appreciated by a person skilled in the art that numerous variations and/or modifications may be made to the present invention as shown in the specific embodiment without departing from the spirit or scope of the invention as broadly described. The present embodiments are therefore to be considered in all respects illustrative and not restrictive.

What is claimed is:

1. A method of growing a zinc oxide film on a surface of a substrate by chemical vapour deposition, the method comprising the steps of:
    a) providing a precursor in vapour form, the precursor substantially comprising $Zn_4O(O_2CNR_AR_B)_6$ where $R_A$ and $R_B$ are any combination of akyl or perfluorakyl groups;
    b) decomposing at least some of the vapour at the surface of the substrate such that the film of zinc oxide forms.

2. The method according to claim 1, wherein $R_A$ and $R_B$ are ethyl groups and the precursor material comprises $Zn_4O(O_2CN(CH_2CH_3)_2)_6$.

3. The method according to claim 1 wherein the substrate is heated to a temperature in the range from 300° C. to 600° C.

4. The method according claim 1 wherein the substrate surface is heated to a temperature in the range from 350° C. to 450° C.

5. The method according to claim 1 wherein the substrate surface is heated to a temperature of substantially 400° C.

6. The method according to claim 1 wherein step (a) comprises subliming a precursor source material to provide the precursor in vapour form.

7. The method according to claim 6 wherein the precursor source material is sublimed at a temperature in the range from 190° C. to 195° C.

8. The method according to claim 1 wherein the method is carried out under vacuum conditions.

9. A method of growing a zinc oxide film on a surface of a substrate, the method comprising carrying out chemical vapour deposition from a single precursor suitable for decomposing at the surface of the substrate such that a film of zinc oxide forms without deliberate introduction of water vapour, wherein the precursor comprises $Zn_4O(O_2CNR_AR_B)_6$ where $R_A$ and $R_B$ are any combination of alkyl or perfluoroalkyl groups.

10. The method according to claim 9 wherein the number of carbon atoms in $R_A$ or $R_B$ is in the range from 1–10.

11. The method according to claim 10, wherein the number of carbon atoms in $R_A$ or $R_B$ is in the range from 1–6.

12. The method according to claim 9 wherein the precursor comprises $Zn_4O(O_2CN(CH_2CH_3)_2)_6$.

13. The method according to claim 9 wherein the method includes a step of heating the surface of the substrate to temperature in the range from 350° C. to 500° C.

14. The method according to claim 13 wherein the surface of the substrate is heated to a temperature in the range from 350° C. to 450° C.

15. The method according to claim 14 wherein the surface of the substrate is heated to a temperature of substantially 400° C.

* * * * *